US011770070B2

(12) United States Patent
Song et al.

(10) Patent No.: US 11,770,070 B2
(45) Date of Patent: Sep. 26, 2023

(54) CAPACITANCE CALCULATION APPARATUS AND METHOD THEREOF

(71) Applicant: NuVolta Technologies (Shanghai) Co., Ltd., Shanghai (CN)

(72) Inventors: Ikgyoo Song, Suwon-si (KR); Xiaoming Xia, Shanghai (CN)

(73) Assignee: NUVOLTA TECHNOLOGIES (SHANGHAI) CO., LTD., Shanghai (CN)

( * ) Notice: Subject to any disclaimer, the term of this patent is extended or adjusted under 35 U.S.C. 154(b) by 193 days.

(21) Appl. No.: 17/379,349

(22) Filed: Jul. 19, 2021

(65) Prior Publication Data

US 2023/0010260 A1    Jan. 12, 2023

(30) Foreign Application Priority Data

Jul. 7, 2021 (CN) .......................... 202110767126.1

(51) Int. Cl.
*H02M 3/07* (2006.01)
*G01R 27/26* (2006.01)
*H02J 7/00* (2006.01)

(52) U.S. Cl.
CPC .......... *H02M 3/07* (2013.01); *G01R 27/2605* (2013.01); *H02J 7/0047* (2013.01); *H02J 2207/20* (2020.01)

(58) Field of Classification Search
CPC .. H02M 3/07; H02M 1/0058; G01R 27/2605; H02J 7/0047; H02J 2207/20; H02J 7/0029; H02J 7/0031; H02J 7/00712
See application file for complete search history.

(56) References Cited

U.S. PATENT DOCUMENTS

| 10,340,794 B1* | 7/2019 | Zhang | H02M 1/32 |
| 2013/0020960 A1* | 1/2013 | Ren | H02M 3/07 |
| | | | 327/536 |
| 2021/0067033 A1* | 3/2021 | Jing | H02M 3/158 |

* cited by examiner

*Primary Examiner* — Amy He
(74) *Attorney, Agent, or Firm* — AP3 Law Firm PLLC (57) ABSTRACT

A method includes providing a current flowing through a first flying capacitor of a switched-capacitor power converter, measuring a first voltage at one terminal of the first flying capacitor at a first voltage measurement time instant, measuring a second voltage at the one terminal of the first flying capacitor at a second voltage measurement time instant, and calculating a capacitance value of the first flying capacitor based on the first voltage, the second voltage, the first voltage measurement time instant and the second voltage measurement time instant.

11 Claims, 7 Drawing Sheets

CAPACITANCE CALCULATION APPARATUS AND METHOD THEREOF

PRIORITY CLAIM

This application claims priority to Chinese Patent Application No. 2021107671261, filed on Jul. 7, 2021, which is hereby incorporated by reference in its entirety.

TECHNICAL FIELD

The present invention relates to a capacitance calculation apparatus and method, and, in particular embodiments, to a capacitance calculation apparatus and method in a switched-capacitor power converter.

BACKGROUND

As technologies further advance, a variety of electronic devices, such as mobile phones, tablet PCs, digital cameras, MP3 players and/or the like, have become popular. Each portable device may employ a plurality of rechargeable battery cells. The plurality of rechargeable battery cells may be connected in series or in parallel so as to form a rechargeable battery pack for storing electrical energy.

Battery chargers are employed to restore energy to the batteries. A battery charger is controlled to provide voltage (e.g., a constant voltage charging mode) and current (e.g., a constant current charging mode) to a battery so as to restore energy to the battery.

There may be a variety of power conversion topologies suitable for charging batteries. In accordance with the topology difference, the power conversion topologies can be divided into three categories, namely, switching power converters, linear regulators and switched-capacitor power converters. In comparison with other topologies, the switched-capacitor converters are less complicated because the switched-capacitor converters are formed by a plurality of switches and a flying capacitor. As a result, the switched-capacitor converters can provide compact and efficient power for charging batteries.

The output voltage ripple of a switched-capacitor converter is directly related to the capacitance value of the flying capacitor of this switched-capacitor converter. Due to various reasons, the capacitance value of the flying capacitor may be reduced. Such a reduced capacitance value may cause a larger voltage ripple. When the switched-capacitor converter is employed to charge a battery, the larger voltage ripple may shorten the battery life. Furthermore, when a dual-phase switched-capacitor converter is used to charge the battery, the unbalanced capacitance values of the two flying capacitors may reduce the battery life cycle. It would be desirable to diagnose the status of the flying capacitor before applying a charge current to the battery. More particularly, it would be desirable to calculate the capacitance value of the flying capacitor and determine the charge current based on the calculated capacitance value. The present disclosure addresses this need.

SUMMARY

These and other problems are generally solved or circumvented, and technical advantages are generally achieved, by preferred embodiments of the present disclosure which provide a capacitance calculation apparatus and method in a switched-capacitor power converter.

In accordance with an embodiment, a power converter comprises a first switch, a second switch, a third switch and a fourth switch connected in series between an input voltage bus and ground, a first flying capacitor connected between a common node of the first switch and the second switch, and a common node of the third switch and the fourth switch, a first current sink connected between the common node of the third switch and the fourth switch and ground, and a controller configured to sink a first current into the first flying capacitor and calculate a capacitance value of the first flying capacitor based on a plurality of detected voltages of the first flying capacitor and corresponding voltage measurement time instants.

In accordance with another embodiment, a method comprises providing a current flowing through a first flying capacitor of a switched-capacitor power converter, measuring a first voltage at one terminal of the first flying capacitor at a first voltage measurement time instant, measuring a second voltage at the one terminal of the first flying capacitor at a second voltage measurement time instant, and calculating a capacitance value of the first flying capacitor based on the first voltage, the second voltage, the first voltage measurement time instant and the second voltage measurement time instant.

In accordance with yet another embodiment, a system comprises a first switch, a second switch, a third switch and a fourth switch connected in series between an input voltage bus and ground, a first flying capacitor connected between a common node of the first switch and the second switch, and a common node of the third switch and the fourth switch, a fifth switch, a sixth switch, a seventh switch and an eighth switch connected in series between the input voltage bus and ground, a second flying capacitor connected between a common node of the fifth switch and the sixth switch, and a common node of the seventh switch and the eighth switch, a first current sink connected between the common node of the third switch and the fourth switch and ground, a second current sink connected between the common node of the seventh switch and the eighth switch and ground, and a controller configured to sink a first current into the first flying capacitor and a second current into the second flying capacitor, and calculate a capacitance value of the first flying capacitor based on a plurality of first detected voltages and corresponding first voltage measurement time instants, and a capacitance value of the second flying capacitor based on a plurality of second detected voltages and corresponding second voltage measurement time instants.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a capacitance calculation apparatus and method in a switched-capacitor power converter. The disclosure may also be applied, however, to a variety of power converters. Hereinafter, various embodiments will be explained in detail with reference to the accompanying drawings.

Figure 1:
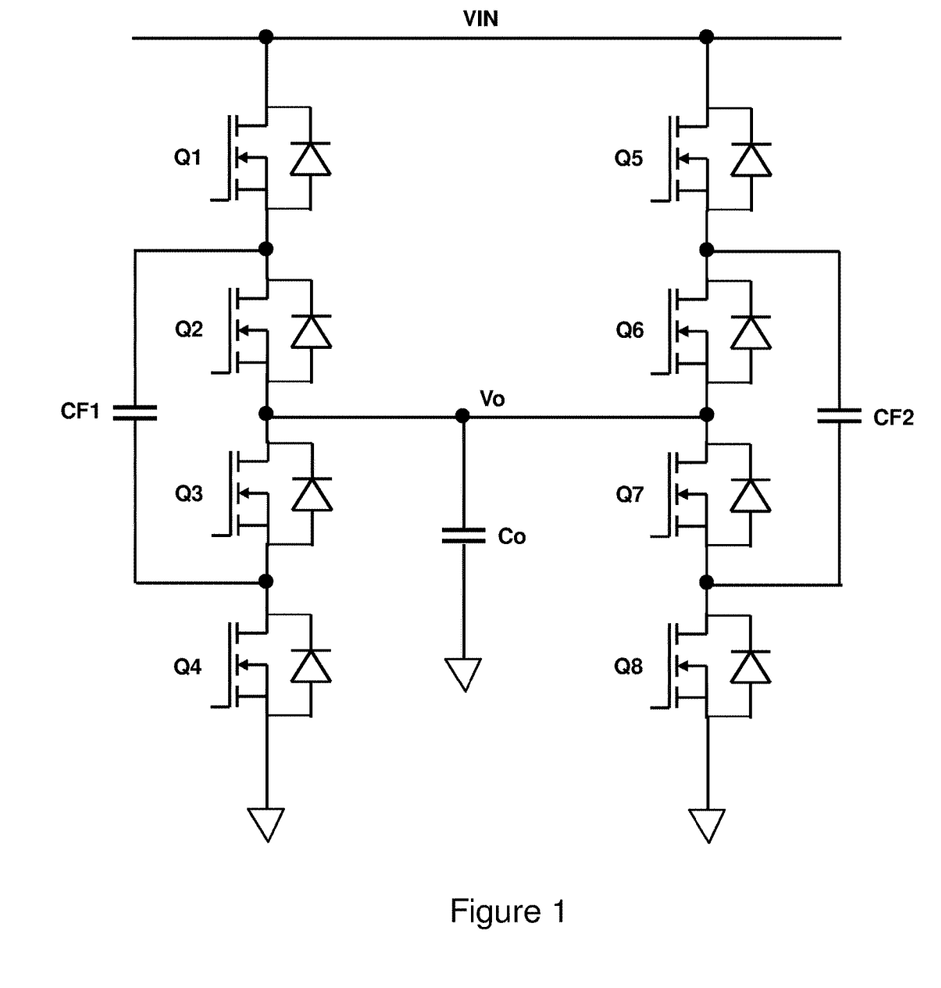
FIG. 1 illustrates a schematic diagram of a dual-phase switched-capacitor power converter in accordance with various embodiments of the present disclosure.

FIG. 1 illustrates a schematic diagram of a dual-phase switched-capacitor power converter in accordance with various embodiments of the present disclosure. The dual-phase switched-capacitor power converter comprises two legs. A first leg comprises a first switch Q1, a second switch Q2, a third switch Q3 and a fourth switch Q4 connected in series between an input voltage bus VIN and ground. A first flying capacitor CF1 is connected between a common node of Q1 and Q2, and a common node of Q3 and Q4. A second leg comprises a fifth switch Q5, a sixth switch Q6, a seventh switch Q7 and an eighth switch Q8 connected in series between the input voltage bus VIN and ground. A second flying capacitor CF2 is connected between a common node of Q5 and Q6, and a common node of Q7 and Q8. As shown in FIG. 1, a common node of Q2 and Q3 is connected to an output voltage bus Vo. A common node of Q6 and Q7 is also connected to the output voltage bus Vo. An output capacitor Co is connected between Vo and ground.

A controller (not shown but illustrated in FIG. 3) is configured to generate gate drive signals for switches Q1-Q8. Furthermore, the controller is configured to calculate the capacitance values of CF1 and CF2 based on a plurality of detected voltages and corresponding voltage measurement time instants. The detailed operation principle of the controller will be described below with respect to FIG. 3.

In some embodiments, the dual-phase switched-capacitor power converter is part of a battery charging system. The dual-phase switched-capacitor power converter is employed to charge a battery. For protecting the battery, an isolation switch (not shown) may be connected between the input voltage bus VIN and a power source providing power for charging the battery. The isolation switch is formed by two back-to-back connected switches. The isolation switch is able to provide reverse blocking capability to isolate the battery from the system.

In accordance with an embodiment, the switches of FIG. 1 (e.g., switches Q1-Q8) may be metal oxide semiconductor field-effect transistor (MOSFET) devices, bipolar junction transistor (BJT) devices, super junction transistor (SJT) devices, insulated gate bipolar transistor (IGBT) devices, gallium nitride (GaN) based power devices and/or the like.

It should be noted while FIG. 1 shows the switches Q1-Q8 are implemented as single n-type transistors, a person skilled in the art would recognize there may be many variations, modifications and alternatives. For example, depending on different applications and design needs, at least some of the switches Q1-Q8 may be implemented as p-type transistors. Furthermore, each switch shown in FIG. 1 may be implemented as a plurality of switches connected in parallel. Moreover, a capacitor may be connected in parallel with one switch to achieve zero voltage switching (ZVS)/zero current switching (ZCS).

In operation, the operating principle of the first leg is similar to that of the second leg except that the drive signals of the first leg (e.g., Q1) and the drive signals of the second leg (e.g., Q5) are 180 degrees out of phase from each other. For simplicity, only the operating principle of the first leg is described below in detail.

In operation, the first leg of the dual-phase switched-capacitor power converter is configured to operate in two different phases. During the first phase, switches Q1 and Q3 are turned on, and switches Q2 and Q4 are turned off. Since switches Q1 and Q3 are turned on, a first conductive path is established between VIN and Vo. The first conductive path is formed by switch Q1, the first flying capacitor CF1 and switch Q3. The current flows from VIN to Vo through the first conductive path. During the first phase, the first flying capacitor CF1 is charged and energy is stored in the first flying capacitor CF1 accordingly.

During the second phase, switches Q1 and Q3 are turned off, and switches Q2 and Q4 are turned on. Since switches Q2 and Q4 are turned on, a second conductive path is established. The second conductive path is formed by switch Q4, the first flying capacitor CF1 and switch Q2. During the second phase, the current discharges the first flying capacitor CF1 and the energy stored in the first flying capacitor CF1 decreases accordingly.

In operation, the dual-phase switched-capacitor power converter functions as a voltage divider. More particularly, the output voltage of the dual-phase switched-capacitor power converter is equal to one half of the input voltage.

Figure 2:
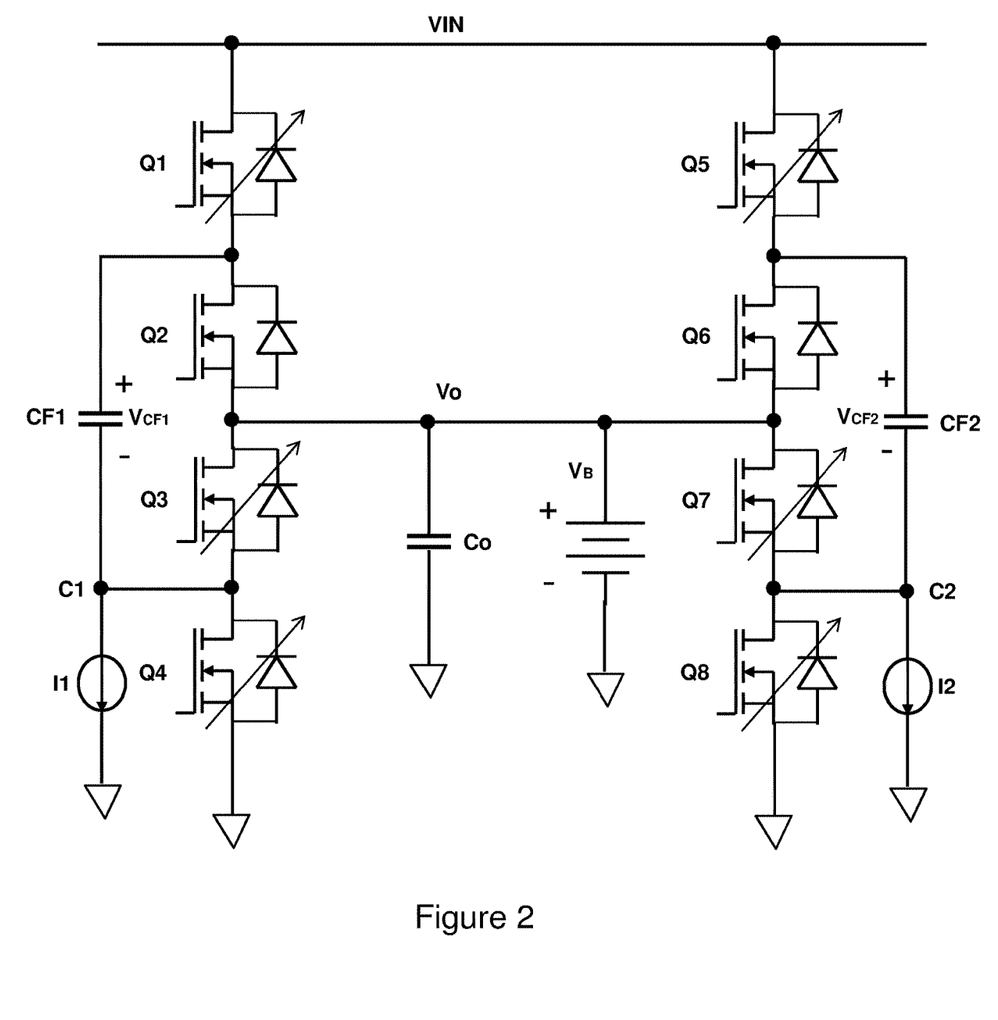
FIG. 2 illustrates a schematic diagram of a capacitance calculation apparatus associated with the dual-phase switched-capacitor power converter shown in FIG. 1 in accordance with various embodiments of the present disclosure.

FIG. 2 illustrates a schematic diagram of a capacitance calculation apparatus associated with the dual-phase switched-capacitor power converter shown in FIG. 1 in accordance with various embodiments of the present disclosure. The capacitance calculation apparatus comprises a battery connected in parallel with the output capacitor Co, a first current sink I1 and a second current sink I2. As shown in FIG. 2, the first current sink is connected between the common node of Q3 and Q4, and ground. The common node of Q3 and Q4 is denoted as C1. The second current sink is connected between the common node of Q7 and Q8, and ground. The common node of Q7 and Q8 is denoted as C2. The first current sink I1 and the second current sink I2 may be formed by suitable current mirrors.

In operation, Q2 and Q6 are turned on, and Q1, Q3, Q4, Q5, Q7 and Q8 are turned off as indicated by the arrows on their symbols. The controller (not shown) is configured to sink a first current into the first flying capacitor CF1 and a second current into the second flying capacitor CF2, respectively. The battery is configured to provide power for the first current through a conductive path formed by Q2, the first flying capacitor CF1 and the first current sink. The battery is configured to provide power for the second current through a conductive path formed by Q6, the second flying capacitor CF2 and the second current sink. As shown in FIG. 2, the voltage of the battery is denoted as $V_B$. The voltage across the first flying capacitor is denoted as VCF1. The voltage across the second flying capacitor is denoted as VCF2 It should be noted that the residue charge stored in flying capacitors (e.g., the first flying capacitor CF1 and the second flying capacitor CF2) should be discharged before sinking a certain current into a corresponding capacitor.

The controller is configured to calculate a capacitance value of the first flying capacitor CF1 based on a plurality of first detected voltages and corresponding first voltage measurement time instants. In particular, after providing a first current flowing through CF1, the controller detects a first voltage on the node C1 at a first voltage measurement time instant, and then detects a second voltage on the node C1 at a second voltage measurement time instant. The first voltage and the first voltage measurement time instant form a first detection point. The second voltage and the second voltage measurement time instant form a second detection point. These two detection points form a voltage-versus-time line. The controller is able to calculate the capacitance value based on the slope of the voltage-versus-time line. Likewise, the controller is configured to calculate a capacitance value of the second flying capacitor CF2 based on a plurality of second detected voltages and corresponding second voltage measurement time instants.

Figure 3:
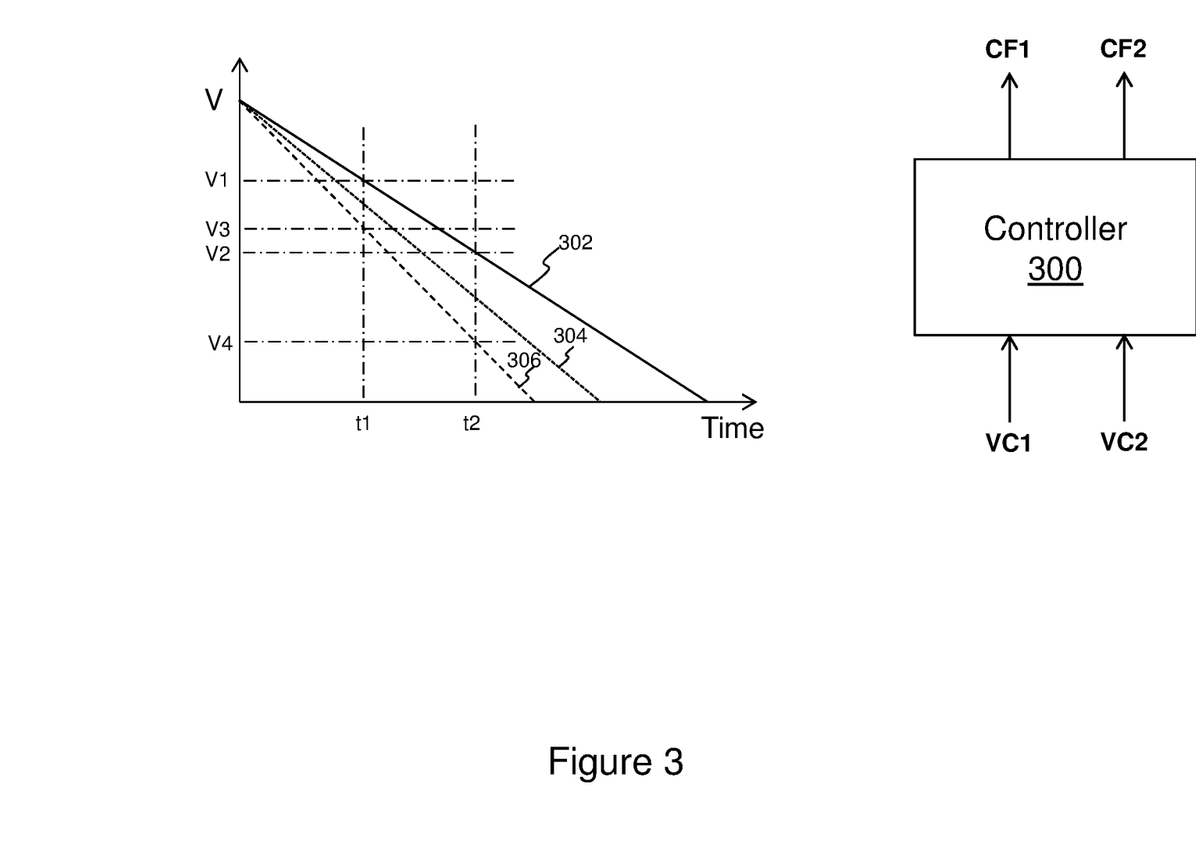
FIG. 3 illustrates various voltage-versus-time lines for calculating the capacitance of the flying capacitor in accordance with various embodiments of the present disclosure.

FIG. 3 illustrates various voltage-versus-time lines for calculating the capacitance of the flying capacitor in accordance with various embodiments of the present disclosure. The horizontal axis of FIG. 3 represents intervals of time. The unit of the horizontal axis is milliseconds. The vertical axis represents the voltage on one terminal (e.g., node C1) of the flying capacitor.

A controller 300 is configured to measure the voltage VC1 on the node C1 and record the corresponding measurement time instant. Based on the measured voltages and the corresponding measurement time instants, the controller 300 is able to calculate the capacitance value (CF1) of the first flying capacitor. Likewise, the controller 300 is configured to measure the voltage VC2 on the node C2 and record the corresponding measurement time instant. Based on the measured voltages and the corresponding measurement time instants, the controller 300 is able to calculate the capacitance value (CF2) of the second flying capacitor. The method of calculating the capacitance value of CF2 is similar to the method of calculating the capacitance value of CF1. For simplicity, only the method of calculating the capacitance value of CF1 is discussed below.

In some embodiments, a first line 302 is a voltage-versus-time line of a flying capacitor having a capacitance value equal to 100 uF. A second line 304 is a voltage-versus-time line of a flying capacitor having a capacitance value equal to 80 uF. A third line 306 is a voltage-versus-time line of a flying capacitor having a capacitance value equal to 60 uF. As shown in FIG. 3, a steep slope means a low capacitance value.

The first line 302 is formed by two detection points. A first detection point comprises V1 and t1. A second detection point comprises V2 and t2. In operation, the controller 300 is configured to sink a first current into CF1. The controller 300 is configured to measure a first voltage (V1) at one terminal of the first flying capacitor CF1 at a first voltage measurement time instant t1, and then measure a second voltage (V2) at the one terminal of the first flying capacitor at a second voltage measurement time instant t2. Referring back to FIG. 2, the terminal of the first flying capacitor is C1. Based on these two detection points, the controller 300 is able to obtain the first line 302 and calculate the capacitance value of the first flying capacitor based on the slope of the first line 302.

In some embodiments, after the first current I1 flows through the first flying capacitor CF1, the first current I1 and the voltage across the first flying capacitor satisfy the following equation:

$$CF1 \times B_{CF1} = I1 \times t \quad (1)$$

In Equation (1), $V_{CF1}$ is the voltage across the first flying capacitor. CF1 is the capacitance of the first flying capacitor, and t is the time at which the voltage across the first flying capacitor is measured.

The voltage across the first flying capacitor, the voltage of the battery and the voltage on the node C1 satisfy the following equation:

$$V_{CF1} = V_B - VC1 \quad (2)$$

In Equation (2), $V_B$ is the voltage of the battery. VC1 is the voltage on the node C1.

According to Equations (1) and (2), the first detection point can be expressed as:

$$\frac{I1 \times t1}{CF1} = V_B - V1 \quad (3)$$

In Equation (3), V1 is the first voltage, and t1 is the first voltage measurement time instant.

According to Equations (1) and (2), the second detection point can be expressed as:

$$\frac{I1 \times t2}{CF1} = V_B - V2 \quad (4)$$

In Equation (4), V2 is the second voltage, and t2 is the second voltage measurement time instant.

The first detection point in Equation (3) and the second detection point in Equation (4) can form a voltage-versus-time line (e.g., first line 302 shown in FIG. 3). This voltage-versus-time line satisfies the following equation:

$$V1 - V2 = \frac{I1}{CF1} \times (t2 - t1) \quad (5)$$

Equation (5) shows the capacitance value of the first flying capacitor CF1 is part of the slope of the first line 302. The slope is equal to I1 divided by the capacitance value of the first flying capacitor. I1 is a predetermined value. After finding the value of the slope, the controller 300 is able to calculate the capacitance value of the first flying capacitor.

FIG. 3 further illustrates two more detection points (V3/t1 and V4/t2). Based on these two detection points, the third line 306 can be drawn.

In operation, the method of calculating the capacitance value discussed above is applicable to both the single-phase switched capacitor power converter and the dual-phase switched capacitor power converter. In the single-phase switched capacitor power converter, the controller 300 calculates a capacitance value deviation percentage based on the capacitance value of the flying capacitor and a preset capacitance value of the flying capacitor. If the capacitance value deviation percentage is too high (e.g., greater than 50%), the controller shuts down the battery charging. If the capacitance value deviation percentage is in an acceptable range, the controller 300 reduces the charging current to protect the battery from being damaged. More particularly, the charge current flowing through the battery is reduced based on the capacitance value deviation percentage. For example, the calculated capacitance value of the flying capacitor is about 75% of the preset capacitance value of the flying capacitor. That is, the capacitance value deviation percentage is about 25%. In response to this capacitance value deviation percentage, the charge current is reduced by 25% (75% of the rated charge current).

In the dual-phase switched capacitor power converter, the controller 300 is configured to receive information of a first detection point including a first voltage on the node C1 and a first voltage measurement time instant, a second detection point including a second voltage on the node C1 and a second voltage measurement time instant, a third detection point including a third voltage on the node C2 and a third voltage measurement time instant, and a fourth detection point including a fourth voltage on the node C2 and a fourth voltage measurement time instant.

The controller 300 is configured to calculate the capacitance value of the first flying capacitor based on a slope of a first voltage-versus-time line formed by the first detection point and the second detection point. The controller 300 is configured to calculate the capacitance value of the second flying capacitor based on a slope of a second voltage-versus-time line formed by the third detection point and the fourth detection point.

After calculating the capacitance values of the first flying capacitor and the second flying capacitor, the controller 300 is able to determine a battery charge current based on the capacitance values of these two flying capacitors. In some embodiments, the controller 300 may reduce the charge current proportional to the capacitance value deviation percentage of any one of these two flying capacitors. In alternative embodiments, the controller 300 may determine whether the capacitance value of the first flying capacitor is substantially equal to the capacitance value of the second flying capacitor, and reduce the charge current after finding a mismatch between the capacitance value of the first flying capacitor and the capacitance value of the second flying capacitor.

Figure 4:
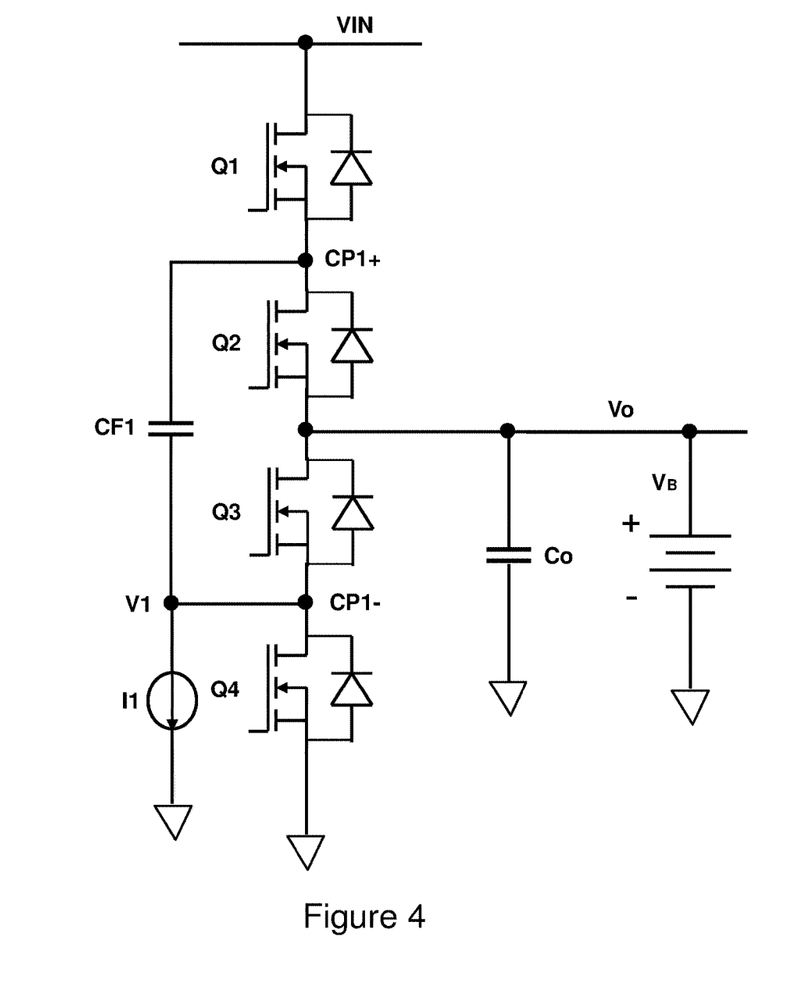
FIG. 4 illustrates a schematic diagram of a capacitance calculation apparatus associated with a single-phase switched-capacitor power converter in accordance with various embodiments of the present disclosure.

FIG. 4 illustrates a schematic diagram of a capacitance calculation apparatus associated with a single-phase switched-capacitor power converter in accordance with various embodiments of the present disclosure. The capacitance calculation apparatus shown in FIG. 4 is similar to that shown in FIG. 2 except that the power converter is a single-phase switched-capacitor power converter. The operating principle of the capacitance calculation apparatus has been discussed in detail with respect to FIG. 3, and hence is not discussed again herein.

It should be noted that FIG. 4 illustrates a capacitance calculation apparatus associated with a single-phase switched-capacitor power converter. The number of phases of the switched-capacitor power converter illustrated herein is limited solely for the purpose of clearly illustrating the inventive aspects of the various embodiments. The present invention is not limited to any specific number of phases. For example, the capacitance calculation apparatus can be used in a multiple-phase switched-capacitor power converter.

Figure 5:
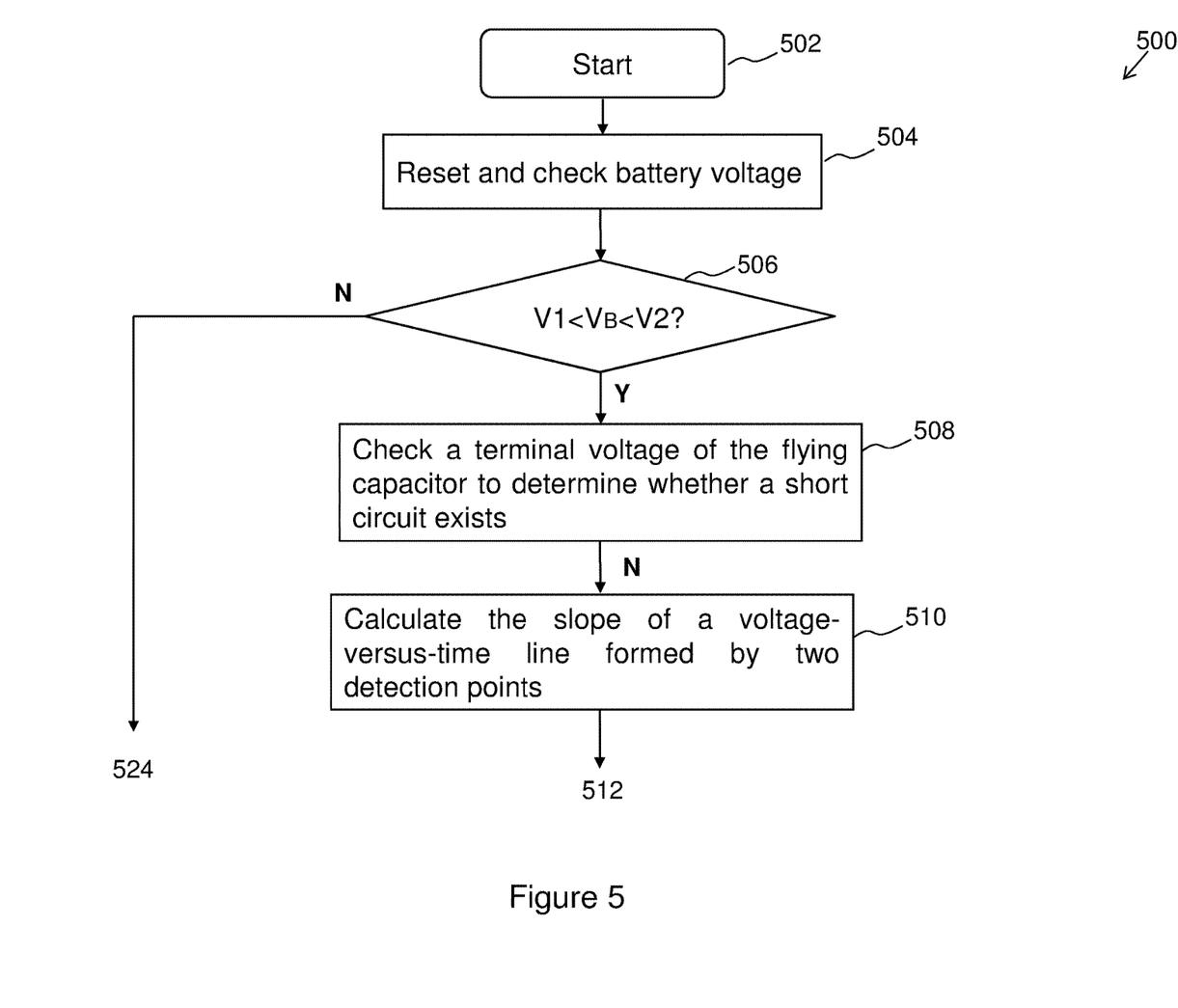
FIGS. 5-6 illustrate a flow chart of a method for configuring a charge current of a switched-capacitor power converter in accordance with various embodiments of the present application.
Figure 6:
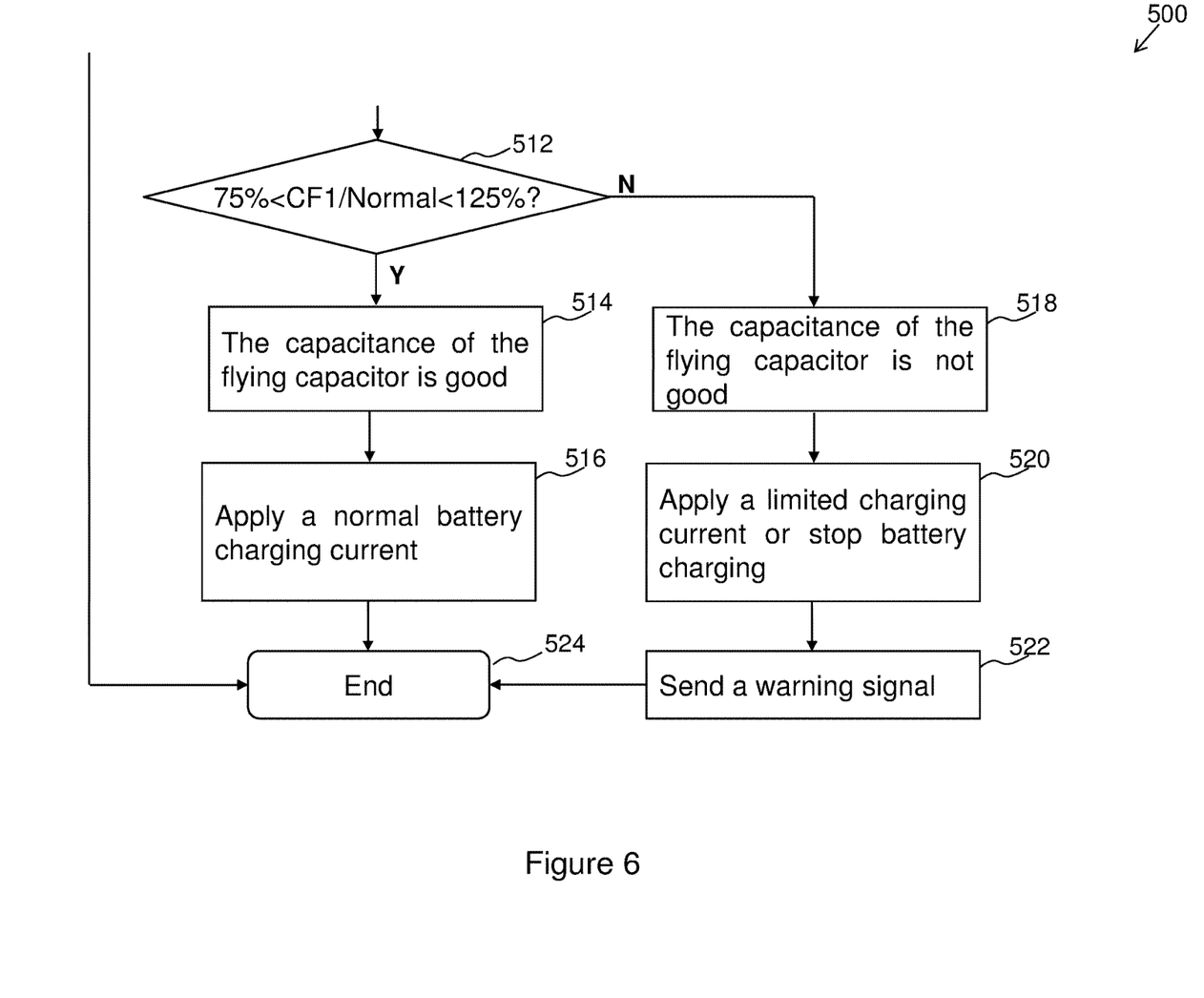

FIGS. 5-6 illustrate a flow chart of a method for configuring a charge current of a switched-capacitor power converter in accordance with various embodiments of the present application. This flow chart shown in FIGS. 5-6 is merely an example, which should not unduly limit the scope of the claims. One of ordinary skill in the art would recognize many variations, alternatives, and modifications. For example, various steps as illustrated in FIGS. 5-6 may be added, removed, replaced, rearranged and repeated.

FIG. 5 illustrates a first portion of the method 500 in accordance with various embodiments of the present application. FIG. 6 illustrates a second portion of the method 500 in accordance with various embodiments of the present application.

Referring back to FIG. 2, a dual-phase switched-capacitor power converter is connected to a battery. In some embodiments, the battery is a single-cell battery. In alternative embodiments, the battery is a dual-cell battery. Prior to charging the battery, a controller is configured to calculate the capacitance values of the flying capacitors, and determine the charging current based on the capacitance values of the flying capacitors. The dual-phase switched-capacitor power converter comprises two flying capacitors. The apparatus and method of calculating the capacitance value of these two flying capacitors are similar to each other. For simplicity, the method 500 is discussed based on one flying capacitor (e.g., CF1 shown in FIG. 2).

The method 500 starts at step 502, and then proceeds with step 504 where the controller reset a plurality of control logic units such as registers. For example, various operation parameters measured previously and saved in the registers are reset before the controller proceeds further. Also at step 504, the controller is configured to check the voltage of the battery.

At step 506, the controller determines whether the voltage of the battery is in a normal voltage range from V1 to V2. For a single-cell battery, the normal voltage range is from about 3.0 V to about 4.3 V. For a dual-cell battery, the normal voltage range is from about 6.0 V to about 8.6 V. At step 506, if the voltage of the battery is not within the normal voltage range, the method 500 proceeds to step 524. Also at step 506, if the voltage of the battery is within the normal voltage range, the method 500 proceeds to step 508.

At step 508, the controller checks a terminal voltage of the flying capacitor within a predetermined time period. In some embodiments, the controller is configured to apply a charge current flowing through the flying capacitor (e.g., CF1 in FIG. 2) and check the terminal voltage (e.g., V1 in FIG. 2) within 20 milliseconds. If V1 cannot be lowered down to a predetermined voltage level (e.g., 0.1 V), the flying capacitor is shorted. After knowing the flying capacitor is shorted, the controller is configured to shut down the dual-phase switched-capacitor power converter. Otherwise, the method 500 proceeds to step 510.

At step 510, the controller is configured to calculate a slope of a voltage-versus-time line formed by two detection points. A first detection point comprises V1 and t1 as shown in FIG. 3. A second detection point comprises V2 and t2 as shown in Figure. As described above with respect to FIG. 3, the controller is able to calculate the capacitance value of the flying capacitor based on the slope of the voltage-versus-time line.

At step 512, the calculated capacitance value is divided by a preset value (normal value) of the flying capacitor to obtain a decimal number associated with a percentage. The decimal number is multiplied by 100 to convert the decimal number into a percent. At step 512, the controller determines whether the percent is in a range from about 75% to about 125%. At step 512, if the percent is not within the range, the method 500 proceeds to step 518. Also at step 506, if the percent is within the range, the method 500 proceeds to step 514.

At step 514, the controller determines the capacitance value of the flying capacitor is good. At step 516, the controller is configured to apply a normal battery charging current to the battery.

At step 518, the controller determines the capacitance value of the flying capacitor is not good. At step 520, the controller is configured to apply a limited battery charging current to the battery. Furthermore, the controller may stop battery charging if the percent is less than 50%. At step 522, the controller sends a warning signal to the battery charging system. At step 524, the method 500 ends.

Figure 7:
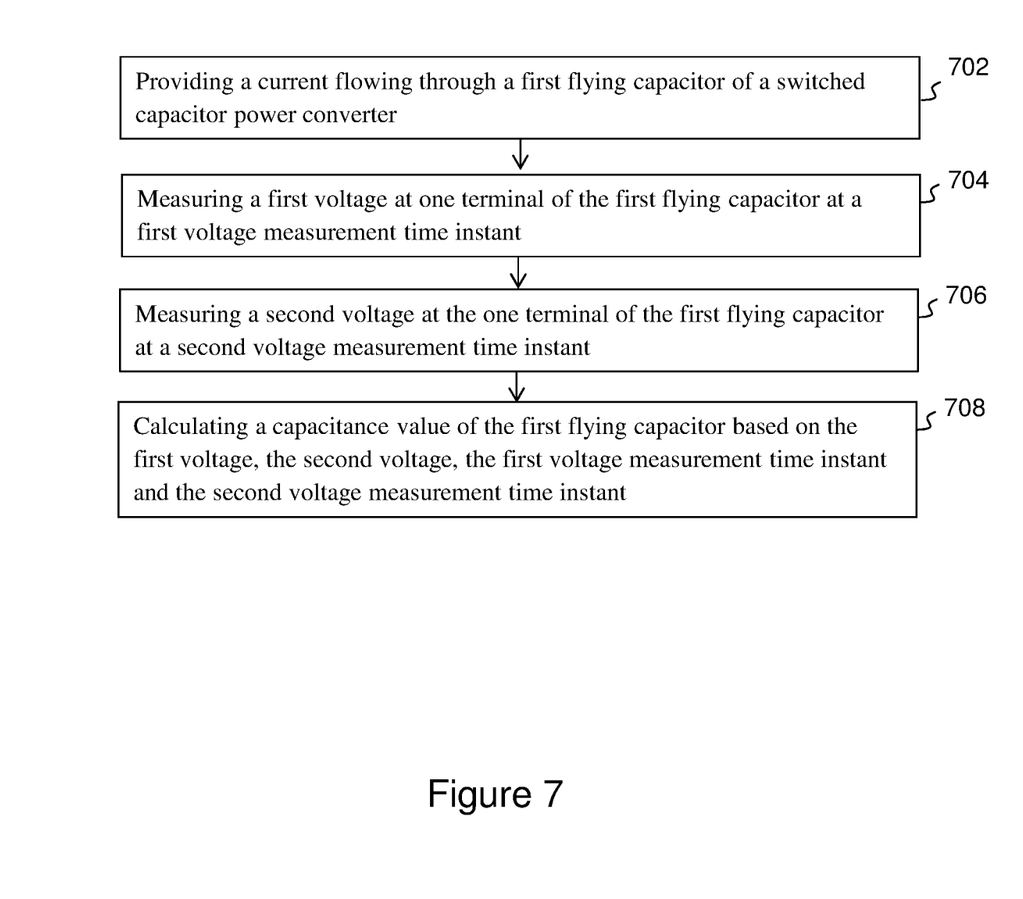
FIG. 7 illustrates a flow chart of calculating a capacitance value of a flying capacitor in a switched-capacitor power converter in accordance with various embodiments of the present disclosure.

FIG. 7 illustrates a flow chart of calculating a capacitance value of a flying capacitor in a switched-capacitor power converter in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

At step 702, a controller is configured to provide a current flowing through a first flying capacitor of a switched-capacitor power converter.

At step 704, the controller is configured to measure a first voltage at one terminal of the first flying capacitor at a first voltage measurement time instant.

At step 706, the controller is configured to measure a second voltage at the one terminal of the first flying capacitor at a second voltage measurement time instant.

At step 708, the controller is configured to calculate a capacitance value of the first flying capacitor based on the first voltage, the second voltage, the first voltage measurement time instant and the second voltage measurement time instant.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A power converter comprising:
   a first switch, a second switch, a third switch and a fourth switch connected in series between an input voltage bus and ground;
   a first flying capacitor connected between a common node of the first switch and the second switch, and a common node of the third switch and the fourth switch;
   a first current sink connected between the common node of the third switch and the fourth switch and ground; and
   a controller configured to sink a first current into the first flying capacitor and calculate a capacitance value of the first flying capacitor based on a plurality of detected voltages of the first flying capacitor and corresponding voltage measurement time instants.

2. The power converter of claim 1, wherein:
   a common node of the second switch and the third switch is coupled to a battery, and wherein the battery is configured to provide power for the first current.

3. The power converter of claim 2, wherein:
   the battery is configured to provide power for the first current through a conductive path formed by the second switch, the first flying capacitor and the first current sink.

4. The power converter of claim 2, wherein:
   the controller is configured to receive information of a first detection point including a first voltage on the common node of the third switch and the fourth switch and a first voltage measurement time instant, and a second detection point including a second voltage on the common node of the third switch and the fourth switch and a second voltage measurement time instant.

5. The power converter of claim 4, wherein:
   the controller is configured to calculate the capacitance value of the first flying capacitor based on a slope of a voltage line formed by the first detection point and the second detection point.

6. The power converter of claim 1, further comprising:
   a fifth switch, a sixth switch, a seventh switch and an eighth switch connected in series between the input voltage bus and ground;
   a second flying capacitor connected between a common node of the fifth switch and the sixth switch, and a common node of the seventh switch and the eighth switch; and
   a second current sink connected between the common node of the seventh switch and the eighth switch and ground.

7. The power converter of claim 6, wherein:
   the controller is configured to sink a second current into the second flying capacitor and calculate a capacitance value of the second flying capacitor based on a plurality of detected voltages of the second flying capacitor and corresponding voltage measurement time instants.

8. The power converter of claim 6, wherein:
   a common node of the sixth switch and the seventh switch is connected to a common node of the second switch and the third switch.

9. A system comprising:
a first switch, a second switch, a third switch and a fourth switch connected in series between an input voltage bus and ground;
a first flying capacitor connected between a common node of the first switch and the second switch, and a common node of the third switch and the fourth switch;
a fifth switch, a sixth switch, a seventh switch and an eighth switch connected in series between the input voltage bus and ground;
a second flying capacitor connected between a common node of the fifth switch and the sixth switch, and a common node of the seventh switch and the eighth switch;
a first current sink connected between the common node of the third switch and the fourth switch and ground;
a second current sink connected between the common node of the seventh switch and the eighth switch and ground; and
a controller configured to sink a first current into the first flying capacitor and a second current into the second flying capacitor, and calculate a capacitance value of the first flying capacitor based on a plurality of first detected voltages and corresponding first voltage measurement time instants, and a capacitance value of the second flying capacitor based on a plurality of second detected voltages and corresponding second voltage measurement time instants.

10. The system of claim 9, wherein:
a common node of the second switch and the third switch is connected to a common node of the sixth switch and the seventh switch, and further connected to a battery, and wherein the battery is configured to provide power for the first current and the second current.

11. The system of claim 9, wherein the controller is configured to:
receive information of a first detection point including a first voltage on the common node of the third switch and the fourth switch and a first voltage measurement time instant, a second detection point including a second voltage on the common node of the third switch and the fourth switch and a second voltage measurement time instant, a third detection point including a third voltage on the common node of the seventh switch and the eighth switch and a third voltage measurement time instant, and a fourth detection point including a fourth voltage on the common node of the seventh switch and the eighth switch and a fourth voltage measurement time instant;
calculate the capacitance value of the first flying capacitor based on a slope of a first voltage line formed by the first detection point and the second detection point; and
calculate the capacitance value of the second flying capacitor based on a slope of a second voltage line formed by the third detection point and the fourth detection point.

* * * * *